(12) United States Patent
Juestel et al.

(10) Patent No.: US 7,202,598 B2
(45) Date of Patent: Apr. 10, 2007

(54) LIGHT-EMITTING DEVICE WITH COATED PHOSPHOR

(75) Inventors: Thomas Juestel, Aachen (DE);
Cornelis Reinder Ronda, Aachen (DE); Walter Mayr, Alsdorf (DE);
Peter Schmidt, Aachen (DE); Volker Ulrich Weiler, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 935 days.

(21) Appl. No.: 09/978,995

(22) Filed: Oct. 16, 2001

(65) Prior Publication Data

US 2002/0105266 A1    Aug. 8, 2002

(30) Foreign Application Priority Data

Oct. 17, 2000    (DE)    ............................ 100 51 242

(51) Int. Cl.
*H01L 33/00*    (2006.01)
*C09K 11/08*    (2006.01)

(52) U.S. Cl. ............... 313/503; 313/501; 252/301.4 R

(58) Field of Classification Search ............... 313/498, 313/499, 907, 502, 509, 512, 501, 503; 428/690, 428/917, 212; 315/169.3; 359/58, 60; 438/26, 438/27, 28, 29, 34; 252/301.4 R
See application file for complete search history.

(56) References Cited

U.S. PATENT DOCUMENTS

| | | | | |
|---|---|---|---|---|
| 4,152,624 | A | * | 5/1979 | Knaebel .................... 313/499 |
| 5,254,849 | A | * | 10/1993 | Murakami et al. ............ 257/98 |
| 5,877,589 | A | * | 3/1999 | Morgan et al. ............. 313/582 |
| 6,045,721 | A | * | 4/2000 | Zachau et al. .............. 313/582 |
| 6,153,123 | A | * | 11/2000 | Hampden-Smith et al. ..................... 252/301.4 S |
| 6,180,029 | B1 | * | 1/2001 | Hampden-Smith et al. . 313/503 |
| 6,464,898 | B1 | * | 10/2002 | Tomoike et al. ............ 313/501 |

FOREIGN PATENT DOCUMENTS

DE    19800983    12/1998

* cited by examiner

*Primary Examiner*—Karabi Guharay

(57) ABSTRACT

The invention describes a light-emitting device (1) which comprises a light-emitting diode and a phosphor layer. To prolong the useful life of the light-emitting device (1), a phosphor (4) in the phosphor layer (2) has a water-resistant coating.

8 Claims, 1 Drawing Sheet

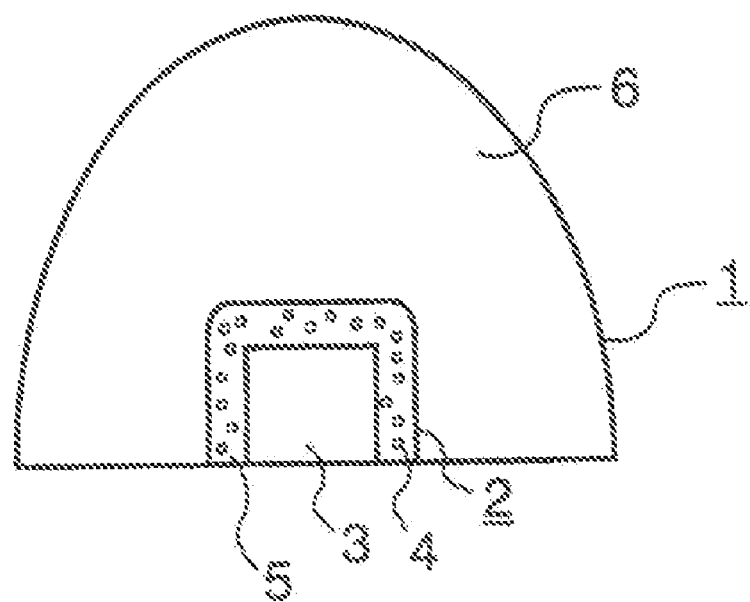

LIGHT-EMITTING DEVICE WITH COATED PHOSPHOR

TECHNICAL FIELD/BACKGROUND OF THE INVENTION

The invention relates to a light-emitting device provided with at least one light-emitting diode and a phosphor layer.

Solid-state light sources, for example light-emitting diodes, in particular semiconductor diodes, have been known for years. The light emission of semiconductor diodes is based on the recombination of electron-hole pairs (excitons) in the transition region of a pn-transition in a semiconductor which is forward-biased. The size of the bandgap of the semiconductor roughly determines the wavelength of the emitted light.

Semiconductor diodes which radiate visible light are also used in color displays. In these color displays, the three constituent colors red, green, and blue are generated by arrays of red-, green-, and blue-emitting semiconductor diodes. A problem here is, however, how to achieve a true-to-life color picture rendering, in particular a true rendering of green and blue in the pictures.

The development of semiconductor diodes which emit UV radiation has increased the possibilities for a true color picture representation on color picture screens with diode addressing. The combination of semiconductor diodes which emit UV radiation with phosphors which convert UV radiation into visible light renders it possible to represent any color of the visible light which may be desired by means of a semiconductor diode, as well as white. Such a color display is known, for example, from DE 19800983 A1. This principle is also applicable to semiconductor diodes which emit violet or blue light, provided suitable phosphors are used.

A major advantage of light-emitting semiconductor diodes in comparison with traditional lamps is their high stability and accordingly their long useful life. A limiting factor for color picture screens with diode addressing may be the stability of the phosphors used in the phosphor layer. Since the phosphors are not fully isolated from the surrounding atmosphere, water-sensitive phosphors may become hydrolyzed by moisture from the air. Comparatively stable phosphors may also be hydrolyzed under the influence of high temperatures and humidity. The degradation of the phosphors in the phosphor layer shortens the useful life of a light-emitting device.

It is an object of the present invention to provide a light-emitting device which is provided with a light-emitting diode and a phosphor layer and which has an improved useful life.

This object is achieved by means of a light-emitting device provided with at least one light-emitting diode and a phosphor layer which comprises a phosphor with a coating.

A degradation caused by moisture from the air is prevented by the coating of the phosphor particle with a dense, water-resistant film.

Preferably, the coating is chosen from the group comprising organic materials, inorganic materials, and glass materials.

It may be preferred that the organic material is chosen from the group comprising latex and polyorganosiloxane.

It may furthermore be preferred that the glass material is chosen from the group comprising borosilicates, phosphosilicates, and alkali silicates.

It may furthermore be preferred that the inorganic material is chosen from the group comprising oxides, borates, phosphates, and combinations of these materials.

These organic, glass-type, or inorganic materials form thin, water-insoluble coatings on the phosphor particles, they do not react with the phosphors, and they are not degraded by UV radiation or radiation with a wavelength between 410 and 450 nm. Furthermore, they are colorless and thus do not influence the color values of the phosphors.

An advantageous embodiment is characterized in that the phosphate is an orthophosphate $MPO_4$, in which M is chosen from the group comprising Al, La, Sc, Y, and Lu, or a polyphosphate with a chain length n of between $10^1$ and $10^6$ and having a composition $(M_{0.5}PO_3)_n$, in which M is chosen from the group of Ca, Sr, and Ba.

These phosphates form particularly satisfactory, closed films with a dense surface on the phosphors.

It is preferred that the phosphor is chosen from the group comprising oxidic phosphors, sulfidic phosphors, aluminate phosphors, borate phosphors, vanadate phosphors, and silicate phosphors.

These phosphors in combination with suitable activators effectively convert UV radiation or blue light into visible light of greater wavelength.

It is preferred that the aluminate phosphor is chosen from the group comprising $Y_3Al_5O_{12}$:Ce, $(Y,Gd)_3(Al,Ga)_5O_{12}$:Ce and $BaMgAl_{10}O_{17}$:Eu,Mn.

SUMMARY OF THE INVENTION

In particular $Y_3Al_5O_{12}$:Ce with a special coating is an efficient, yellow-emitting phosphor when excited by blue light.

It is particularly highly preferred that the sulfidic phosphor is chosen from the group comprising SrS:Eu, $SrGa_2S_4$:Eu, $(Sr,Ca,Ba)(Al,Ga)_2S_4$:Eu, $SrY_2S_4$:Eu, (Ca,Sr)S:Eu, (Mg,Ca)S:Eu, SrS:Ce, CaS:Ce, $CaLa_2S_4$:Ce and CaS:Ce,Eu.

In particular phosphors comprising a sulfide such as SrS:Eu are hydrolyzed by moisture from the air in accordance with the reaction equation

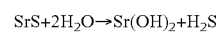

$$SrS + 2H_2O \rightarrow Sr(OH)_2 + H_2S$$

and are accordingly stabilized by a coating, preferably with a silicate.

It is particularly highly preferred that the phosphor layer comprises SrS:Eu with a coating of $SiO_2$ and a silicate.

BRIEF DESCRIPTION OF THE DRAWING

The invention will be explained in more detail below with reference to a FIGURE and four embodiments, wherein:

FIG. 1 shows a light-emitting device.

DESCRIPTION OF THE PREFERRED EMBODIMENTS

As FIG. 1 shows, a light-emitting device 1 comprises in the simplest case a diode 2 which emits UV radiation or blue light, and a phosphor layer 2 which is provided on the diode 3. The phosphor layer 2 in this embodiment comprises a transparent layer 5 with a phosphor 4 having a water-resistant coating. The material for the transparent layer 5 may be, for example, polyacrylate, polystyrol, epoxide resin, polypropylene, polycarbonate, or some other polymer.

Such a light-emitting device 1 as a mass-manufactured product is usually encapsulated in an epoxide housing 6, a lens of epoxide resin being molded thereto. This lens serves to improve the guiding of the light from the light-emitting device 1. The phosphor layer 2 in this embodiment may alternatively be provided between the transparent layer 5 and the epoxide housing 6. The phosphor layer may also be provided as a coating on the outside of the epoxide housing 6. In these cases, the phosphor layer 2 may comprise a phosphor preparation comprising a phosphor 4 with a coating. A further embodiment provides that the phosphor layer 2 is formed from the epoxide resin and an added phosphor 4 with coating. The phosphor layer 2 forms the epoxide housing 6 in this embodiment.

If the light-emitting device is to emit, for example, white light, then the phosphor layer will comprise a physical mixture of a red-emitting, a blue-emitting, and a green-emitting phosphor.

Large, two-dimensional displays may be readily manufactured by means of an array of light-emitting diodes 3. Such an array of light-emitting diodes 3 may be covered by a glass plate which is imprinted with a phosphor layer 2. The phosphor layer 2 comprises red-, green-, and blue-emitting phosphors which are provided in the pattern of three dots arranged in a triangle.

A UV-emitting diode 3 may comprise, for example, InGaN or GaN. This UV-emitting diodes 3 have their emission maximum between 370 and 410 nm with a half-value width FWHM <50 nm. A diode 3 which emits blue light with a wavelength between 410 and 450 nm may comprise, for example, InGaN/AlGaN structures. Means for supplying electrical energy to a diode 3 which emits UV or blue light are provided for maintaining the light emission. These means comprise at least two electrodes.

Phosphors which may be used in the phosphor layer 2 are, for example, oxidic phosphors, sulfidic phosphors, aluminate phosphors, borate phosphors, vanadate phosphors, or silicate phosphors. In particular, the following phosphors may be used: $Y_3Al_5O_{12}:Ce$, $(Y,Gd)_3(Al,Ga)_5O_{12}:Ce$, $BaMgAl_{10}O_{17}:Eu,Mn$, $Y_2O_2S:Eu,Bi$, $YVO_4:Eu,Bi$, $YBO_3:Ce,Tb$, $(Sr,Ba)_2SiO_4:Eu$, $Ca_2MgSi_2O_7:Eu$, $Sr_2CeO_4:Eu$, $SrS:Eu$, $SrGa_2S_4:Eu$, $(Sr,Ca,Ba)(Al,Ga)_2S_4:Eu$, $SrY_2S_4:Eu$, $(Ca,Sr)S:Eu$, $(Mg,Ca)S:Eu$, $SrS:Ce$, $CaS:Ce$, $CaLa_2S_4:Ce$ or $CaS:Ce,Eu$.

The particles of the phosphor 4 are covered with a thin, even, and water-resistant layer. The layer thickness of the water-resistant coating is usually 0.001 to 0.2 µm and is accordingly so thin that photons can penetrate it without substantial energy losses.

The manufacture of the coating follows different methods in dependence on the coating material.

To coat a phosphor 4 with latex, latex is dissolved in an organic solvent. Then a phosphor 4 is suspended in this solution. Latex is precipitated onto the particles of the phosphor 2 through the addition of a solvent in which latex is insoluble. After filtration and drying of the coated phosphor, the latex is fused at higher temperatures.

A coating with a polysiloxane may be obtained in that a polysiloxane is directly mixed with a phosphor 4. Alternatively, a polysiloxane may first be dissolved in an organic solvent, and the phosphor 4 may subsequently be suspended in this solution. After evaporation of the solvent, the polysiloxane adhering to the particles of the phosphor 4 may be crosslinked with thermal, catalytic, or radical initiation.

To manufacture a glass-type coating from a borosilicate, a phosphosilicate, or an alkali silicate, a colloidal solution of a silicate, for example of a potassium silicate or sodium silicate, is added to an ammonium hydroxide solution. After a phosphor 4 has been added, the resulting mixture is vigorously stirred. The phosphor 4 with coating is filtered off and dried at 100° C.

It may be advantageous in certain cases for the coating to comprise $SiO_2$ besides the silicate material. To manufacture such a coating, a colloidal solution of a borosilicate, a phosphosilicate, or an alkali silicate is added to an ammonium hydroxide solution. After addition of a phosphor 4, a solution of tetraethyl orthosilicate in ethanol is added to the mixture, and the resulting mixture is vigorously stirred. The phosphor 4 with coating is sucked off and dried at 100° C.

To enhance the stability, a second coating layer may be provided. To achieve this, a colloidal solution of a borosilicate, a phosphosilicate, or an alkali silicate is added to an ammonium hydroxide solution as described above. First the phosphor 4 already provided with a coating is added to this mixture, and subsequently a solution of tetraethyl orthosilicate in ethanol. After vigorous stirring, the twice-coated phosphor 4 is sucked off and dried at 100° C.

To manufacture a coating of an inorganic material, suspensions are made which contain the desired coating material, for example an oxide, a borate, a phosphate, or a combination of these coating materials.

Alternatively, the suspensions may also contain precursors of the coating materials according to the invention, which are subsequently converted into the desired particles through a thermal treatment. Thus, for example, a suspension with $Mg(OH)_2$ may first be provided on the particles of the phosphor 4 and then be thermally converted into a layer of MgO.

The starting compound used for a coating with an oxide such as, for example, MgO, $Al_2O_3$ or $SiO_2$ is a water-soluble metal salt, in particular a water-soluble nitrate, acetate, acetylacetonate, or citrate. One or several of these metal salts are dissolved in water in the manufacture of the coating solution, and the pH value is adjusted to 7. The phosphor 4 to be coated is dispersed in this solution. The aqueous suspension of the phosphor 4 thus obtained is kept in contact with an atmosphere containing ammonia while stirring until the pH value of the suspension has risen to 9.5 and either the oxide or the hydroxide is precipitated onto the phosphor particles. The phosphor 4 with coating is filtered off and dried. If the phosphor is now coated with a hydroxide, it is subsequently calcinated at an elevated temperature such that the hydroxide is converted into the corresponding oxide.

For coating a phosphor 4 with $SiO_2$, a solution of a monomeric, hydrolyzable silicic acid ester, for example tetraethyl orthosilicate, is preferably prepared first. After addition of the phosphor 4, the resulting mixture is vigorously stirred, and the solvent, for example ethanol, is subsequently removed. The phosphor 4 with coating is exposed to an atmosphere saturated with water vapor at 80° C. so as to obtain a dense, closed coating of $SiO_2$.

Alternatively, the hydrolyzable silicic acid ester may already be partly condensed beforehand. For this purpose, a solution of the monomeric silicic acid ester is mixed with catalytic quantities of dilute HCl and heated for 24 h under reflux. Then the solvent and any not pre-condensed silicic acid ester are removed by distillation.

Starting compounds used for a coating with an orthophosphate are soluble metal salts having the composition $MX_3 \cdot yH_2O$, where M represents one of the metals Al, Sc, Y, Lu, and La, X represents one or several of the anions $CH_3COO^-$, $RO^-$, $NO_3^-$, $Cl^-$ $CH_3COCH=C(O^-)CH_3$ and $^-OOCCH_2CH(OH)(COO^-)CH_2COO^-$, and y represents a number greater than or equal to zero. Water is generally used as the solvent.

Phosphoric acid, preferably 85% phosphoric acid and urea are added to this solution. After the resulting solution has been filtered, preferably through a thin nylon filter, the phosphor 4 is added. The suspension is heated while stirring until the pH value of the suspension has become 7. After cooling down to room temperature, the phosphor 4 with coating is filtered off, rinsed, and dried.

For the manufacture of a coating made of a polyphosphate, an aqueous solution of a polyphosphate is added to a suspension of the phosphor 4 to be coated. The polyphosphate has a composition $(M_{0.5}PO_3)_n$, with M chosen from the group of Ca, Sr, and Ba, and the chain length n lying between $10^1$ and $10^6$. An aqueous solution of a water-soluble salt of Ca, Sr, or Ba is added to this suspension. The pH value of the suspension is kept in the alkaline region through addition of ammonia or sodium lye. The phosphor 4 with coating is filtered off, rinsed, and dried.

To manufacture a coating made of a borate, an alcoholic solution of a boric acid ester is added to a suspension of the phosphor 4 to be coated, which ester is derived from polyboric acids having the general formula $H_{n-2}B_nO_{2n-1}$ with $n \leq 3$. The resulting reaction mixture is stirred at room temperature for 2 to 24 hours, and the phosphor 4 with coating is filtered off and dried.

Embodiments of the invention will be explained in more detail below, representing examples of how the invention may be carried into practice.

Embodiment 1

First 30.0 g tetraethyl orthosilicate (TEOS) in 40.0 ml water-free ethanol were mixed with 0.864 ml 0.1 M HCl. The resulting reaction mixture was heated for 24 h under reflux. Then the TEOS which had not condensed and the ethanol were removed by distillation.

10.0 g SrS:Eu was suspended in 50.0 ml water-free ethanol. 2.04 g previously condensed TEOS was added to this suspension, and the resulting mixture was stirred for 15 min. After distillation of the solvent in vacuo, the resulting SrS:Eu coated with TEOS was exposed to air containing water vapor at a temperature of 80° C. The layer thickness of the coating of $SiO_2$ was 100 nm.

Table 1 shows that the quantum efficiency is only slightly reduced by the coating of the phosphor particles of SrS:Eu with a 100 nm thick layer of $SiO_2$.

TABLE 1

Quantum efficiency (Q.E.), absorption (Abs.), and surface composition of SrS:Eu and SrS:Eu coated with $SiO_2$.

| | QE [%] | Abs. [%] | Sr [at. %] | S [at. %] | O [at. %] | Si [at. %] | C [at. %] |
|---|---|---|---|---|---|---|---|
| SrS:Eu | 100 | 76.4 | 16.3 | 14.2 | 66.3 | — | 3.2 |
| $SiO_2$—SrS:Eu | 97 | 77.6 | — | — | 46.3 | 12.5 | 41.2 |

Subsequently a light-emitting device 1 with a diode 3 emitting blue light and a phosphor layer 2 comprising SrS:Eu coated with $SiO_2$ was manufactured. For this purpose, an InGaN/AlGaN diode 3 was surrounded with a transparent layer 5 of polyacrylate. The transparent layer 5 further comprised SrS:Eu coated with $SiO_2$ as the phosphor 4. The light-emitting device 1 was subsequently encapsulated in an epoxide housing 6.

Embodiment 2

250 g ammonia was mixed with 750 g water, and 25 g of a colloidal potassium silicate solution (15% by weight of potassium silicate) was added to this mixture. Then 60 g SrS:Eu was added, and the resulting suspension was vigorously stirred. A solution of 10 ml tetraethyl orthosilicate in 750 ml ethanol was dropped into the suspension over a period of less than 15 min. The resulting reaction mixture was stirred at room temperature for 90 minutes. The coated SrS:Eu was filtered off and dried at 100° C. The coated phosphor was then again suspended in a mixture of 250 g ammonia in 750 g water and 25 g of a colloidal potassium silicate solution. 1 liter ethanol and subsequently a mixture of 10 ml tetraethyl orthosilicate in 500 ml ethanol were dropped into this suspension. The resulting reaction mixture was stirred at room temperature for 60 minutes. SrS:Eu with a coating of potassium silicate was filtered off and dried at 100° C.

Then a light-emitting device 1 with a diode 3 emitting blue light and a phosphor layer 2 comprising SrS:Eu coated with potassium silicate was manufactured. For this purpose, a InGaN/AlGaN diode 3 was surrounded with a transparent layer 5 of polyacrylate. A phosphor layer 2 with SrS:Eu coated with potassium silicate was provided as the phosphor 4 was provided on the transparent layer 5. The light-emitting device 1 was subsequently encapsulated in an epoxide housing 6.

Embodiment 3

4.45 g $Al(NO_3)_3 \cdot 9H_2O$ was dissolved in 1.25 l demineralized water. 1.37 g of 85% $H_3PO_4$ and 36.04 g urea were added to this solution. After filtration of the resulting mixture through a 0.2 μm nylon filter, 50 g $SrGa_2S_4$:Eu was added. The suspension was stirred at 90° C. until the pH value of the solution was 7. The suspension was allowed to cool down to room temperature, and the phosphor $SrGa_2S_4$:Eu coated with $AlPO_4$ was filtered off, washed several times with demineralized water, and dried at 100° C. for one hour.

Subsequently a light-emitting device 1 with a diode 3 emitting blue light and a phosphor layer 2 comprising $SrGa_2S_4$:Eu coated with $AlPO_4$ was manufactured. For this purpose, a InGaN/AlGaN diode 3 was surrounded with a transparent layer 5 of polyacrylate. The transparent layer 5 further comprised $AlPO_4$-coated $SrGa_2S_4$:Eu as the phosphor 4. The light-emitting device 1 was subsequently encapsulated in an epoxide housing 6.

Embodiment 4

1.0 g $Mg(NO_3)_2 \cdot 6H_2O$ (3.9 mmole) was dissolved in 50 ml water. 8.0 g $Y_3Al_5O_{12}$:Ce was suspended in 50 ml water, and the magnesium nitrate solution was then added to this suspension. The resulting suspension with a pH value of 7.5 was vigorously stirred. The pH value of the suspension was then raised to pH 9.1 by means of a concentrated ammonia solution, so that the precipitation of $Mg(OH)_2$ was initiated. After two hours of vigorous stirring, the coated phosphor was filtered off, dried at 80° C., and finally calcinated for two hours at 250° C.

Then a light-emitting device 1 with a diode 3 emitting blue light and a phosphor layer 2 comprising $Y_3Al_5O_{12}$:Ce coated with MgO was manufactured. For this purpose, an InGaN/AlGaN diode 3 was surrounded with a transparent layer 5 of polyacrylate. The transparent layer 5 further comprised $Y_3Al_5O_{12}$:Ce coated with MgO as the phosphor 4. The light-emitting device 1 was then encapsulated in an epoxide housing 6.

The invention claimed is:

1. A light-emitting device provided with at least one light-emitting diode and a phosphor layer which comprises at least a phosphor comprised of phosphor particles with a coating, characterized in that the coating is a glass material.

2. A light-emitting device as claimed in claim 1, characterized in that the glass material is chosen from the group consisting of borosilicates, phosphosilicates, and alkali silicates.

3. A light-emitting device as claimed in claim 1, characterized in that the phosphor is chosen from the group to consisting of oxidic phosphors, sulfidic phosphors, aluminate phosphors, borate phosphors, vanadate phosphors and silicate phosphors.

4. A light-emitting device as claimed in claim 3, characterized in that the aluminate phosphor is chosen from the group consisting of $Y_3Al_5O_{12}$:Ce, $(Y, Gd)_3(Al,Ga)_5O_{12}$:Ce and $BaMgAl_{10}O_{17}$:Eu, Mn.

5. A light-emitting device as claimed in claim 3, characterized in that the sulfide phosphor is chosen from the group consisting of SrS:Eu, $SrGa_2S_4$:Eu, (Sr,Ca,Ba) $(AlGa)_2S_4$:Eu, $SrY_2S_4$;Eu, (CaSr)S:Eu, (Mg,Ca)S:Eu, SrS:Ce, CaS:Ce, $CaLa_2S_4$:Ce and CaS:Ce,Eu.

6. A light-emitting device as claimed in claim 1, characterized in that the phosphor layer comprises SrS;Eu with a coating of $SiO_2$ and a silicate glass.

7. A light-emitting device provided with at least one light-emitting diode and a phosphor layer which comprises at least a phosphor comprised of phosphor particles with a coating, characterized in that the coating is an inorganic borate material.

8. A light-emitting device provided with at least one light-emitting diode and a phosphor layer which comprises at least a phosphor comprised of phosphor particles with a coating, characterized in that the phosphor is chosen from the group consisting of aluminate and vandate phosphors, the coating comprises a glass material chosen from the group consisting of borosilicates, phosphosilicates and alkali silicates.

* * * * *